United States Patent
Vashchenko et al.

(10) Patent No.: US 7,872,840 B1
(45) Date of Patent: Jan. 18, 2011

(54) ERASE PIN PROTECTION IN EEPROM USING ACTIVE SNAPBACK ESD DEVICE WITH POSITIVE FEEDBACK AND SHUTDOWN

(75) Inventors: Vladislay Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 569 days.

(21) Appl. No.: 11/893,847

(22) Filed: Aug. 17, 2007

(51) Int. Cl.
*H02H 9/00* (2006.01)
(52) U.S. Cl. ........................................... 361/56
(58) Field of Classification Search ................. 361/56
See application file for complete search history.

(56) References Cited

U.S. PATENT DOCUMENTS

| | | | | |
|---|---|---|---|---|
| 6,055,183 A | * | 4/2000 | Ho et al. | 365/185.09 |
| 6,078,487 A | * | 6/2000 | Partovi et al. | 361/56 |
| 6,970,335 B1 | * | 11/2005 | Vashchenko et al. | 361/56 |
| 7,027,277 B1 | * | 4/2006 | Vashchenko et al. | 361/56 |

\* cited by examiner

*Primary Examiner*—Stephen W Jackson
(74) *Attorney, Agent, or Firm*—Jurgen K. Vollrath; Vollrath & Associates

(57) ABSTRACT

In an ESD protection circuit for an EEPROM erase pin a snapback device is provided for discharging high ESD currents, whereas the snapback device is operated in active mode during low voltage electrical overstress and to discharge post ESD event current by connecting an RC circuit over the control electrode of the snapback device. In order to handle high voltage normal operating conditions the snapback device is deactivated once VDD is applied by pulling the control electrode to ground using a VDD controlled switch.

14 Claims, 1 Drawing Sheet

ERASE PIN PROTECTION IN EEPROM USING ACTIVE SNAPBACK ESD DEVICE WITH POSITIVE FEEDBACK AND SHUTDOWN

FIELD OF THE INVENTION

The invention relates to the protection of the erase pins of Electrically Erasable Programmable Read Only Memory (EEPROM) devices against Electrostatic Discharge (ESD) events.

BACKGROUND OF THE INVENTION

Integrated circuits that include MOS transistors are particularly susceptible to damage by electrostatic discharge (ESD) events, e.g. when the circuit is touched by a person handling the circuit causing static electricity to discharge from the handler through the circuit. This is particularly the case once the circuit has been packaged but prior to it being installed in a product.

In the case of an EEPROM device, ESD events or other electrical overstress events can cause the device to be reprogrammed. Even though the programming of an EEPROM requires a certain voltage combination on the erase and enable pins of the EEPROM, the high voltages provided by an ESD event together with the effect of coupling with other pins can cause a reprogramming of the EEPROM.

A prior art solution to this problem is shown schematically in FIG. 1, which shows an SCR 100 connected to the erase pins of a memory array, as depicted by the memory array capacitance 102. The schematic representation depicts the electrical connections as having a resistance 104 and capacitance 106.

Test results have however shown that due to the low leakage associated with these memory devices, ESD events as well as low current overstress events cause long term storage of residual voltage in the memory devices. Even the use of snapback ESD protection devices therefore does not always provide a satisfactory solution. In fact an overstress event followed by an ESD event may cause particularly high residual voltage if the electrical overstress event is below the triggering voltage of the snapback device.

Furthermore, the erase voltage used during normal operation of the memory device is itself a high voltage, of the order of 20V, and thus threatens to trigger the snapback device during normal operation.

The present invention seeks to provide a solution to these problems

SUMMARY OF THE INVENTION

According to the invention there is provided a method of protecting an EEPROM erase pin against electrical overstress, comprising coupling a snapback device having a control electrode (active snapback device) (for example an LDSCR) between the erase pin of the EEPROM and ground to operate in snapback mode during high voltage ESD events that exceed the snapback voltage of the device, and operating the snapback device in active mode during lower voltage electrical overstress conditions by controlling the control electrode. The snapback device may comprise any SCR, NPN transistor, or NMOS device. For instance the SCR may comprise any one of an LDSCR, NLDMOS-SCR, DeMOS-SCR, LVTSCR, and a Bipolar SCR. The NPN transistor may comprise an NPN BJT or lateral BJT.

The control electrode may be controlled by means of an RC circuit coupled across it. During normal operation, when VDD is applied to the circuit, the snapback device may be disabled by pulling the control gate of the snapback device to ground. To achieve this, a VDD controlled transistor, for example an NMOS transistor, may be coupled between the control gate of the ESD device and ground.

Further, according to the invention there is provided an ESD protection circuit for an EEPROM comprising a snapback device connected between the protected node and ground and having a control electrode, an RC circuit connected to the control electrode with the capacitor of the RC circuit being connected to between the protected node and the control electrode and the resistor being connected between the control electrode and ground, the RC circuit having a time constant that is much shorter than for a Merrill clamp. Typically the time constant of the RC circuit is chosen to be about 100 ns. The circuit may include means for deactivating the snapback device when VDD is applied to the EEPROM. The means for deactivating may include a VDD controlled switch connected between the control electrode of the snapback device and ground. The switch may comprise an NMOS transistor the gate of which is connected to VDD.

DETAILED DESCRIPTION OF THE INVENTION

The present invention proposes an ESD protection circuit for the erase pin of an EEPROM which takes into account both the need for high current discharge during ESD events as well as low current discharge. The present invention therefore proposes the use of a snapback device to handle the high current discharge, such as an SCR. In order to deal with low voltage overstress conditions and also to deal with low current discharge after the snapback device has turned off, use is made of the channel current of the snapback device by operating it in active mode.

Figure 1:
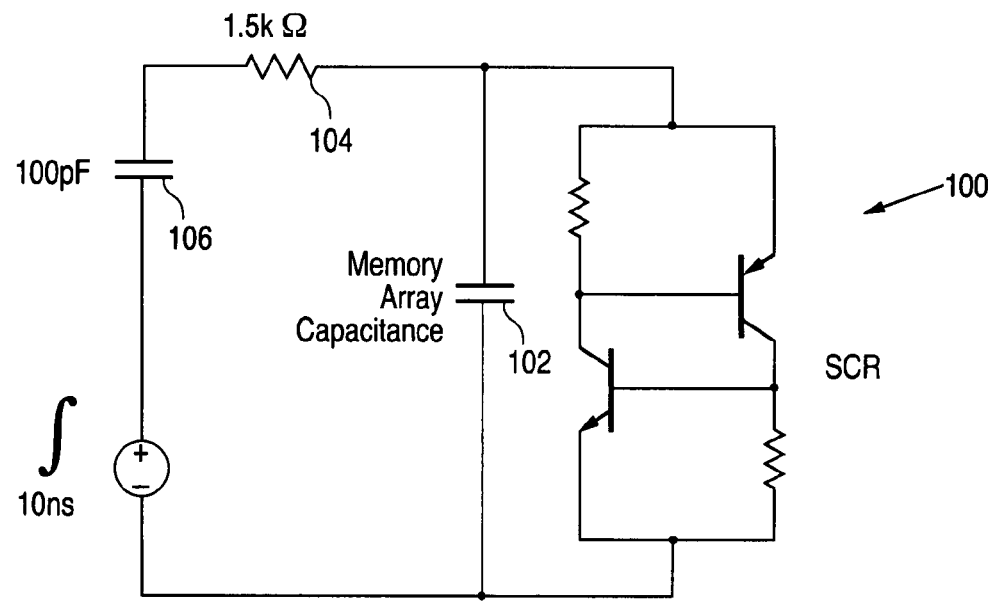
FIG. 1 is a circuit diagram representing an LDMOS protection circuit as known in the art.
Figure 2:
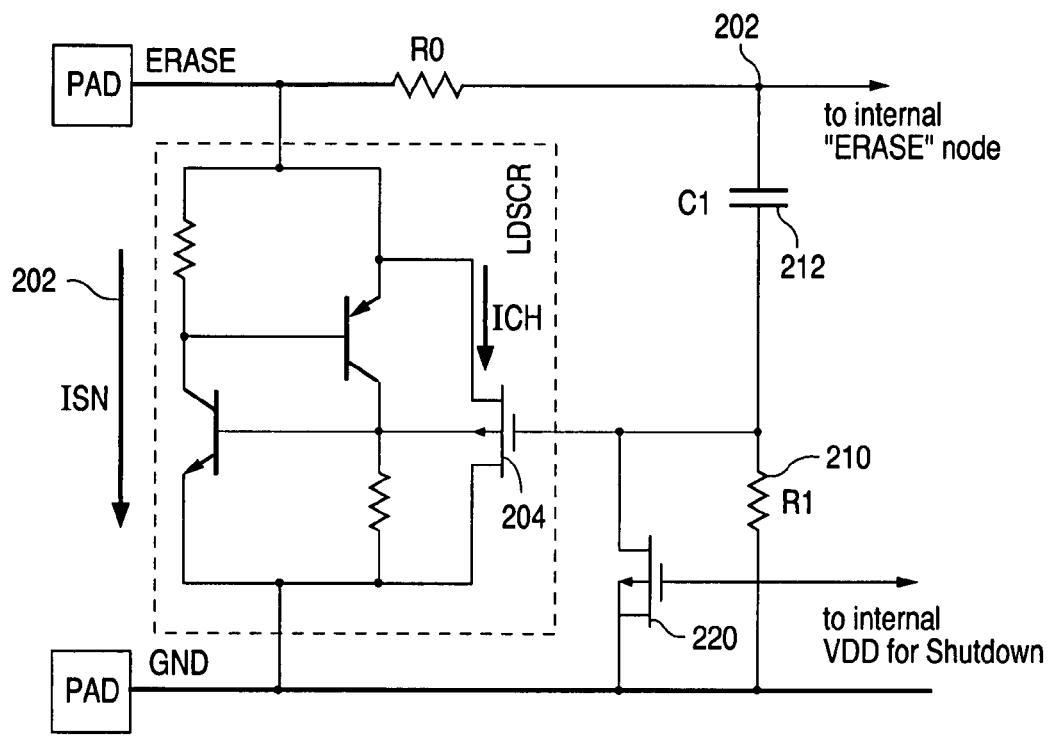
FIG. 2 is a circuit diagram of one embodiment of an overstress protection circuit for an EEPROM erase pin in accordance with the invention.

FIG. 2 shows one embodiment of the invention in which an LDSCR 200 is coupled across the erase pin of an EEPROM (not shown). It will be appreciated that the node 202 could be connected to the erase pins of an entire EEPROM array. Thus during an ESD event in which the voltage exceeds the triggering voltage of the LDSCR 200, the LDSCR snaps back and discharges the major ESD current (ISN). To ensure that residual current caused by the ESD event, which is stored in the EEPROM, is discharged after the ESD voltage drops below the triggering voltage VT, the LDSCR 200 is thereafter operated in active mode by keeping the control electrode 204 of the LDSCR high for a certain period of time. This ensures that channel current ICH continues to flow after an ESD event. It also allows current from low voltage overstress events (below VT) to be dissipated. In this embodiment an RC circuit comprising a resistor 210 and a capacitor 212 is connected to the control gate 204. The snapback current ISN that flows during an ESD event is approximately 2 A for an LDSCR with width W of approximately 200 μm as defined by the equation ISN=W*0.1 mA/um. In contrast, the channel current ICH is approximately W*10 uA/um which is approximately 200 mA. Since the residual current is discharged in a rather short period of time (approximately 100 ns) the time constant RC of the RC circuit is chosen accordingly and is therefore much smaller than is used in a Merrill Clamp, which typically turns off over a period of 4 to 8 μs.

As mentioned above, the present invention seeks not only to provide for the flow of channel current after an ESD event but also addresses overstress situations below the snapback voltage level. In such a case the LDSCR does not snap back at all. However, the voltage on the erase pin of the EEPROM opens the LDSCR channel to provide a discharge path.

During normal operation when power is supplied to the chip, the LDSCR is deactivated through the use of an NMOS device 220 that is controlled by VDD. Thus when VDD is applied the NMOS 220 turns on and shorts out the LDSCR gate, thereby keeping the LDSCR device gate below Vt. Since the capacitor 212 is fully charged no leakage occurs.

What is claimed is:

1. A method of protecting an EEPROM erase pin against electrical overstress, comprising
   coupling a snapback device having a control electrode (for example an LDSCR) between ground and the erase pin node that is connected to the erase pin of the EEPROM, and
   operating the snapback device in active mode during lower voltage electrical overstress conditions by controlling the control electrode, and
   disabling the snapback device during normal operation, when VDD is applied to the circuit.

2. A method of claim 1, wherein the control electrode is controlled by means of an RC circuit coupled across it, with the capacitor of the RC circuit connected between the erase pin node and the control electrode, and the resistor of the RC circuit connected between the control electrode and ground.

3. A method of claim 2, wherein the snapback device is an LDSCR.

4. A method of claim 1, wherein the disabling comprises pulling the control gate of the snapback device to ground.

5. A method of claim 4, wherein the control gate is pulled to ground by coupling an NMOS transistor between the control gate of the ESD device and ground and pulling the gate of the NMOS transistor high.

6. A method of claim 5, wherein the gate of the NMOS transistor is controlled by connecting it to an internal VDD node.

7. An ESD protection circuit for an EEPROM erase pin node comprising
   A snapback device connected between the erase pin node and ground and having a control electrode, an RC circuit connected to the control electrode with the capacitor of the RC circuit being connected between the erase pin node and the control electrode and the resistor of the RC circuit being connected between the control electrode and ground, the RC circuit having a time constant that is shorter than for a typical Merrill clamp.

8. An ESD protection circuit of claim 7 wherein the time constant of the RC circuit is about 100 ns.

9. An ESD protection circuit of claim 7, further comprising means for deactivating the snapback device when VDD is applied to the EEPROM.

10. An ESD protection circuit of claim 9, wherein the means for deactivating the snapback device comprises a VDD controlled switch connected between the control electrode of the snapback device and ground.

11. An ESD protection circuit of claim 10, wherein the switch comprises an NMOS transistor the gate of which is connected to a VDD node.

12. An ESD protection circuit of claim 7, wherein the snapback device comprises an SCR, NPN transistor, or an NMOS device.

13. An ESD protection circuit of claim 12, wherein the SCR comprises any one of an LDSCR, NLDMOS-SCR, DeMOS-SCR, LVTSCR, and a Bipolar SCR).

14. An ESD protection circuit of claim 12, wherein the NPN transistor comprises an NPN BJT or lateral BJT.

* * * * *